United States Patent
Lesea et al.

(10) Patent No.: US 10,476,598 B1
(45) Date of Patent: Nov. 12, 2019

(54) OPTICAL COMMUNICATION CIRCUITS

(71) Applicant: Xilinx, Inc., San Jose, CA (US)

(72) Inventors: Austin H. Lesea, Los Gatos, CA (US); Stephen M. Trimberger, Incline Village, NV (US)

(73) Assignee: XILINX, INC., San Jose, CA (US)

( * ) Notice: Subject to any disclaimer, the term of this patent is extended or adjusted under 35 U.S.C. 154(b) by 324 days.

(21) Appl. No.: 15/219,005

(22) Filed: Jul. 25, 2016

Related U.S. Application Data (62) Division of application No. 14/297,527, filed on Jun. 5, 2014, now Pat. No. 9,432,121.

(51) Int. Cl.
*H01L 25/00* (2006.01)
*H04B 10/50* (2013.01)
*H04B 10/508* (2013.01)

(52) U.S. Cl.
CPC ......... *H04B 10/503* (2013.01); *H04B 10/508* (2013.01); *H04B 10/5053* (2013.01)

(58) Field of Classification Search
None
See application file for complete search history.

(56) References Cited

U.S. PATENT DOCUMENTS

| | | | |
|---|---|---|---|
| 6,583,645 B1 | 6/2003 | Bennett et al. | |
| 6,753,239 B1 | 6/2004 | Conn | |
| 6,945,712 B1 | 9/2005 | Conn | |
| 6,963,123 B2 | 11/2005 | Nagase et al. | |
| 8,546,955 B1 | 10/2013 | Wu | |
| 2002/0012492 A1 | 1/2002 | Takahashi et al. | |
| 2004/0208623 A1 | 10/2004 | Kumar | |
| 2006/0043585 A1 | 3/2006 | Sukegawa et al. | |
| 2006/0126993 A1 | 6/2006 | Piede et al. | |
| 2006/0269294 A1 | 11/2006 | Kikuchi | |
| 2010/0040380 A1 | 2/2010 | Lewin | |
| 2011/0091221 A1 | 4/2011 | De Gabory et al. | |
| 2012/0224856 A1 | 9/2012 | Sato et al. | |
| 2013/0176552 A1* | 7/2013 | Brown | H01L 27/14806 356/51 |

(Continued)

FOREIGN PATENT DOCUMENTS

EP 0875776 A2 11/1998

OTHER PUBLICATIONS

Tokunari et al., "High-bandwidth optical MCM: FPGA with optical I/O on waveguide-integrated SLC", 2010, IEEE, pp. 1-4.*

(Continued)

*Primary Examiner* — Reema Patel
(74) *Attorney, Agent, or Firm* — LeRoy D. Maunu (57) ABSTRACT

Various apparatuses, circuits, systems, and methods for optical communication are disclosed. In some implementations, an apparatus includes a package substrate and f first interposer mounted on the package substrate. The apparatus also includes a logic circuit and an optical interface circuit connected to the logic circuit via the first interposer. One of the optical interface circuit or the logic circuit is mounted on the first interposer. The optical interface circuit includes a driver circuit configured to receive electronic data signals from the logic circuit. The optical interface circuit also includes an optical transmitter circuit coupled to the driver circuit and configured to output optical data signals encoding the electronic data signals.

12 Claims, 5 Drawing Sheets

(56) References Cited

U.S. PATENT DOCUMENTS

2015/0103964 A1* 4/2015 Wadatsumi ............ H04L 7/0037
　　　　　　　　　　　　　　　　　　　　　　　375/371

OTHER PUBLICATIONS

Tokunari, Masao, et al., "High-bandwidth optical MCM: FPGA with optical I/O on waveguide-integrated SLC", CPMT Symposium Japan, 2010 IEEE, IEEE, Piscataway, NJ, USA, Aug. 24, 2010, pp. 1-4.

Ishii, Y. et al., "Demonstration of On-PCB Optical Interconnecting Using Surface-Mount Package and Polymer Waveguide", 2003 Proceedings 53rd Electronic Components and Technology Conference. (ECTC). New Orleans, LA, May 27-30, 2003; Proceedings of the Electronic Components and Technology Conference, New York, NY, IEEE, US, vol. CONF. 53, May 27, 2003, pp. 1147-1152.

Fedeli, Jean-Marc, "Lecture: Integration of silicon photonics with electronics", CEA-LETI, Helios, Silicon Photonics—PhD course prepared with FP7-224312 Helios project, Chapter 10, May 15, 2010, pp. 1-51.

Li, M.P., et al., "Transferring High-Speed Data over Long Distances with Combined FPGA and Multichannel Optical Modules", White Paper, WP 01177 1.0, Avago Technologies, Altera Corporation, AV02-3383EN, Mar. 21, 2012, pp. 1-7.

Tanaka, S. et al., "Silicon Photonics Optical Transmitter Technology for Tb/s-class I/O Co-packaged with CPU", Jan. 2014, pp. 123-131, vol. 50, No. 1, Fujitsu Sci Tech J.

Zhang, Yue el al., "Within-Tier Cooling and Thermal Isolation Technologies for Heterogeneous 3D ICs", 3D Systems Integration Conference (3DIC), 2013 IEEE International, Oct. 2-4, 2013, pp. 1-6, IEEE, San Francisco, CA.

U.S. Appl. No. 14/297,535, filed Jun. 5, 2014, Trimberger, Stephen M. et al.

U.S. Appl. No. 14/449,052, filed Jul. 31, 2014, Trimberger, Stephen M. et al.

* cited by examiner

OPTICAL COMMUNICATION CIRCUITS

CROSS-REFERENCE TO RELATED APPLICATION

This application is a divisional of U.S. patent application Ser. No. 14/297,527 filed on Jun. 5, 2014, which is hereby incorporated herein by reference.

FIELD OF THE DISCLOSURE

The disclosure generally relates to high speed communication, and more particularly to optical communication.

BACKGROUND

Fiber optics are used in a number of applications for high speed data communication. Communication systems based on fiber optics transmit data as modulated laser light through an optical fiber (e.g., glass or plastic). Fiber optic communication systems are advantageous for many applications as noise is not induced in the fiber by the presence of electromagnetic signals in the environment.

SUMMARY

Various apparatuses, circuits, systems, and methods for optical communication are disclosed. An apparatus is disclosed that includes a package substrate and a first interposer mounted on the package substrate. The apparatus also includes a logic circuit and an optical interface circuit connected to the logic circuit via the first. One of the optical interface circuit or the logic circuit is mounted on the first interposer. The optical interface circuit includes a driver circuit configured to receive electronic data signals from the logic circuit. The optical interface circuit also includes an optical transmitter circuit coupled to the driver circuit and configured to output optical data signals encoding the electronic data signals.

A method is also disclosed for manufacturing an apparatus having an optical communication circuit. A logic circuit is mounted on a first interposer. An optical interface circuit is formed on a second interposer by mounting an optical transmitter circuit on the second interposer, mounting a driver circuit on the second interposer, and connecting the driver circuit via wiring on the second interposer. The first interposer is mounted on a substrate having one or more wiring layers. The second interposer is mounted on the substrate. The logic circuit die and the optical interface circuit are connected via the first interposer, the one or more wiring layers, and the second interposer.

An apparatus having an optical serializer is also disclosed. The optical serializer includes a plurality of optical modulators. Each of the optical modulators is configured to receive a respective bit of a parallel multi-bit data bus in a first bit period. Each of the optical modulators is configured to output a respective optical pulse representing the value of the respective bit. The optical pulse has a duration less than the first bit period. For each of the optical modulators, the optical serializer includes an optical delay line configured to delay the optical pulses output from the optical modulator to produce a respective optical output signal. Each optical delay line delays pulses by a respective length of time unique to the optical modulator connected thereto. The optical serializer also includes an optical combiner configured to combine the respective optical output signals produced by the optical delay line into a single optical beam.

A method for optical serialization is also disclosed. For each bit of parallel multi-bit data bus transmitted in a first bit period, a respective optical modulator is used to provide a respective optical pulse. The optical pulse has a duration less than the first bit period. Each of the respective optical pulses is delayed by a respective length of time unique to the optical modulator to produce a respective optical output signal. The respective optical output signals are combined into a single optical beam.

Other features will be recognized from consideration of the Detailed Description and Claims, which follow.

BRIEF DESCRIPTION OF THE DRAWINGS

Various aspects and features of the disclosed methods, circuits, and systems will become apparent upon review of the following detailed description and upon reference to the drawings in which.

DETAILED DESCRIPTION OF THE DRAWINGS

Various aspects of the present disclosure are believed to be applicable to a variety of different types of apparatuses, circuits, systems, and methods involving optical communication.

Various integrated circuit (IC) packages are disclosed that include a logic circuit and an optical communication circuit. One or both of the logic circuit and optical communication circuit are assembled on respective interposers for later mounting and connection in an IC package. This allows the logic circuit and optical communication circuit assemblies to be separately manufactured and tested prior to final assembly in an IC package. Accordingly, flawed logic circuits and/or optical communication circuits can be identified before being manufactured into the final IC package. In this manner, the production yield for manufacture of the IC package is increased.

The disclosed implementations are applicable IC packages including various logic circuits in combination with an optical communication circuit. For example, in some applications, the logic circuit may include a programmable IC. For ease of explanation, the examples in the disclosure may be generally discussed with reference to an IC package including an electronic logic circuit (e.g., a programmable IC) and an optical communication circuit.

In some implementations, a logic circuit and a serializer circuit are mounted on a first interposer and an optical interface circuit is mounted on a second interposer. The first and second interposers are mounted on a package substrate having one or more wiring layers. The serializer circuit is connected to the optical interface circuit via the first and second interposers and the wiring layers.

In some implementations, the optical interface circuit may include both an optical transmitter and a driver configured to provide electronic data signals to the optical transmitter for transmission. Some optical communication circuits include a driver connected to an optical transmitter, and both the driver and optical transmitter are mounted directly on a package substrate and connected via wiring layers on the substrate. However, high speed communication though the wiring layers can dissipate a significant amount of power. By including the optical transmitter and the driver on the same interposer, the transmission line distance between the optical transmitter and the driver is reduced and power efficiency improved. In some implementations, signal lines between the optical transmitter and the driver have lengths less than or equal to ⅛ the wavelength of a highest frequency of the data signals.

In some implementations, the serializer circuit may instead be mounted on the second interposer with the optical interface circuit. By integrating the serializer circuit with the optical communication circuit on the same interposer, the data rate of the serializer circuit is not limited by the transmission through wiring layers of the substrate (e.g., 100 ohm differential signal lines). The logic circuit is connected to the serializer circuit by several parallel channels via the first interposer, the wiring layers on the substrate, and the second wiring layers. The serializer circuit is connected to the driver via wiring on the second interposer.

In some implementations, for example, the serializer circuit and the driver are connected by signal lines having lengths less than or equal to ⅛ the wavelength of a highest frequency used by the serializer circuit to provide the serial data to the driver circuit. Use of signal lines having lengths less than or equal to ⅛ the wavelength allows signal lines to be implemented with higher impedances than the 100 ohm differential signal lines included in the wiring layers on the substrate.

Although the examples and implementations are primarily discussed with reference to a serializer circuit that provides serialized data for transmission by an optical transmitter, the implementations are not so limited. For instance, the disclosed examples and implementations may be adapted for an optical receiver by replacing the serializer with a deserializer and replacing the optical transmitter with an optical receiver. Furthermore, the disclosed examples and implementations may be adapted for a transceiver configured to transmit and receive optical data. In such implementations, the serializer is replaced by a serializer/deserializer circuit (Serdes). For ease of explanation, the examples and implementations are primarily discussed with reference to a serializer that provides serialized data for transmission by an optical transmitter. In some implementations, one of the two interposers may be omitted. For example, the first interposer may be omitted and the logic circuit may be mounted directly on the substrate. Conversely, the second interposer may be omitted and the optical interface circuit may be mounted directly on the substrate.

Figure 1:
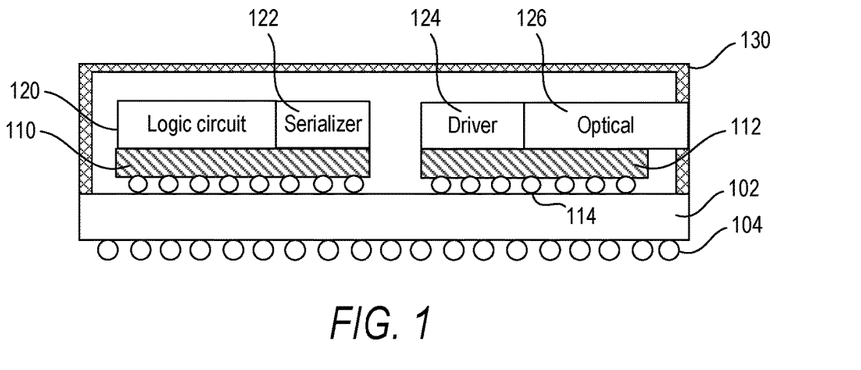
FIG. 1 shows an IC package including a logic circuit and a serializer circuit mounted on a substrate via a first interposer and an optical interface circuit mounted on the substrate via a second interposer.

Turning now to the figures, FIG. 1 shows a first IC package configured in accordance with one or more implementations. In this example, a logic circuit 120 and a serializer circuit 122 are mounted on a first interposer 110. An optical interface circuit, including a driver circuit 124 and an optical transmitter 126, is mounted on a second interposer 112. The interposers include contacts 114 (e.g., microbumps) for connecting the circuits mounted thereon with external circuits. The first and second interposers are mounted on a substrate 102 of the package. The logic circuit and serializer circuit may be communicatively coupled to one with another by wiring layers (not shown) in the interposer 110 and also communicatively coupled to the substrate by way of through-silicon vias (not shown) and wiring layers in the interposer and the contacts 114. Driver circuit 124 and optical transmitter 126 are similarly communicatively coupled to one with another by wiring layers (not shown) in the interposer 112. The substrate includes one or more wiring layers (not shown) for interconnecting the interposers and external package terminals 104 (e.g., solderballs). In this example, the circuits are encapsulated by a package cover 130. Alternatively or additionally, a molding compound may be disposed over the circuits. In this example, the optical transmitter extends through the package cover 130 to provide an optical data on the side of the package cover.

Figure 2:
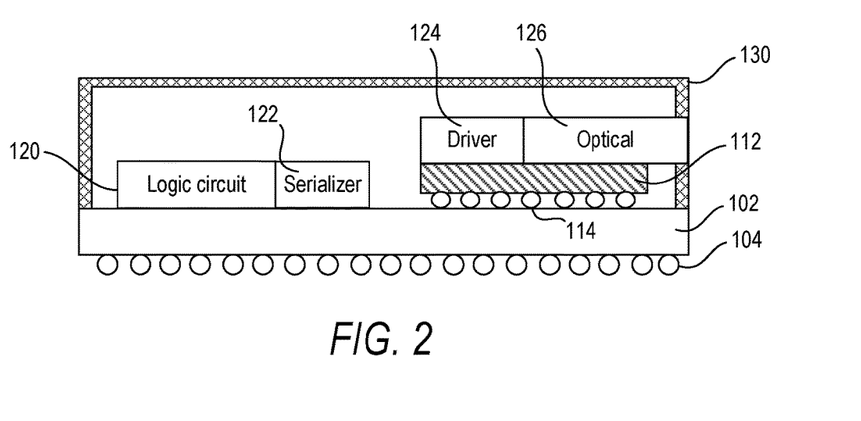
FIG. 2 shows an IC package including a logic circuit and a serializer circuit mounted directly on a substrate and an optical interface circuit mounted on the substrate via an interposer.

FIG. 2 shows a second IC package configured in accordance with one or more implementations. The IC package in this example includes components that are similar to those of the IC package shown in FIG. 1, as indicated by the reference numbers. In this example, the logic circuit 120 and serializer circuit 122 are not mounted on an interposer (e.g., 110). Rather, the logic circuit 120 and serializer circuit 122 are directly mounted on the substrate 102.

Figure 3:
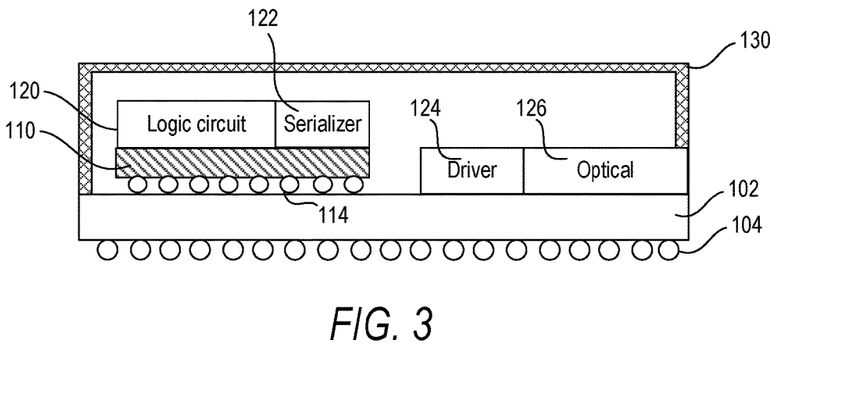
FIG. 3 shows an IC package including a logic circuit and a serializer circuit mounted on a substrate via an interposer and an optical interface circuit mounted directly on the substrate.

FIG. 3 shows a third IC package configured in accordance with one or more implementations. The IC package in this example includes components that are similar to those of the IC package shown in FIG. 1, as indicated by the reference numbers. In this example, the optical communication circuit (i.e., the driver circuit 124 and the optical transmitter 126) is not mounted on an interposer. Rather, the optical communication circuit is directly mounted on the substrate 102.

Figure 4:
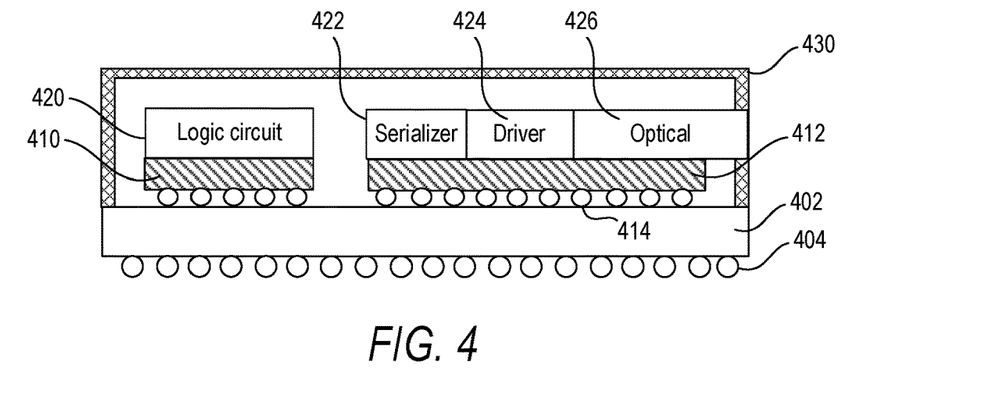
FIG. 4 shows an IC package including a logic circuit mounted on a substrate via a first interposer and a serializer and optical interface circuits mounted on the substrate via a second interposer.

FIG. 4 shows a fourth IC package configured in accordance with one or more implementations. In this example, a logic circuit is mounted on a first interposer 410. An optical interface circuit, including a serializer circuit 422, a driver circuit 424, and an optical transmitter 426, is mounted on a second interposer 412. The interposers include contacts 414 (e.g., microbumps) for connecting the circuits mounted thereon with external circuits. The first and second interposers are mounted on a substrate 402 of the package. The substrate includes one or more wiring layers (not shown) for interconnecting the interposers and external package terminals 404 (e.g., solderballs). In this example, the circuits are encapsulated by a package cover 430.

Figure 5:
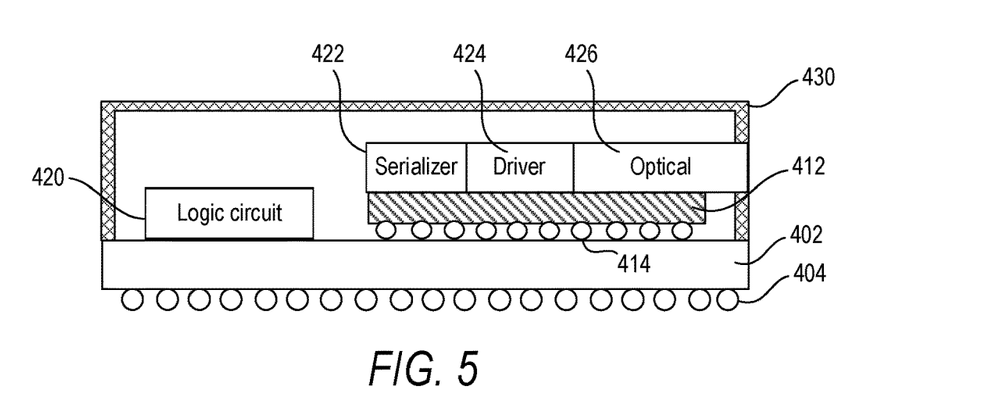
FIG. 5 shows an IC package including a logic circuit mounted directly on a substrate and a serializer and optical interface circuits mounted on the substrate via an interposer.

FIG. 5 shows a fifth IC package configured in accordance with one or more implementations. The IC package in this example includes components that are similar to those of the IC package shown in FIG. 4, as indicated by the reference numbers. In this example, the logic circuit 420 is not mounted on an interposer (e.g., 410). Rather, the logic circuit 420 is directly mounted on the substrate 402.

Figure 6:
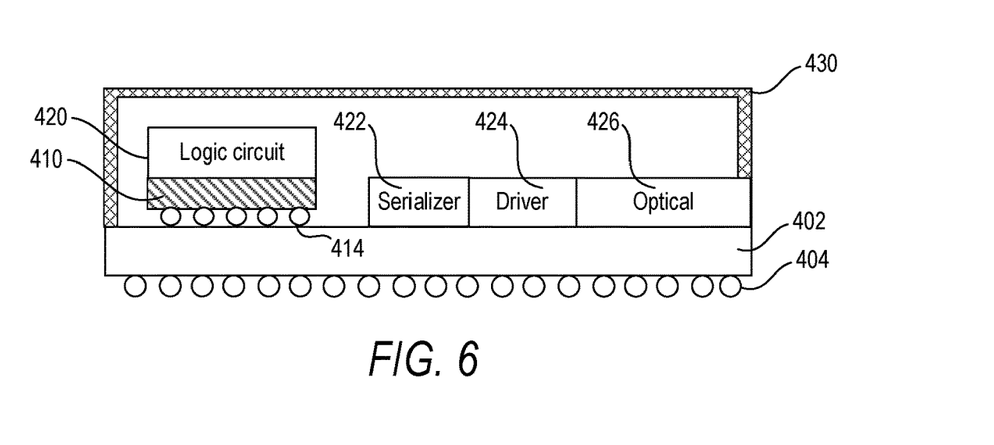
FIG. 6 shows an IC package including a logic circuit mounted on a substrate via an interposer and a serializer and optical interface circuits mounted directly on the substrate.

FIG. 6 shows a sixth IC package configured in accordance with one or more implementations. The IC package in this example includes components that are similar to those of the IC package shown in FIG. 4, as indicated by the reference numbers. In this example, the optical communication circuit (i.e., the serializer circuit 422, the driver circuit 424, and the optical transmitter 426) is not mounted on an interposer. Rather, the optical communication circuit is directly mounted on the substrate 402.

Apparatuses and methods for serializing optical data signals are also disclosed. In some implementations, an optical serialization circuit includes a plurality of optical modulators. Each of the optical modulators is configured to receive a respective bit of a parallel multi-bit data bus in a first bit period. Each optical modulator is further configured to output a respective optical pulse representing the value of the received bit and having a duration less than the first bit period. For an N-bit data bus, the duration may be, for example, the first bit period divided by N.

The optical serialization circuit also includes a set of optical delay lines. Each delay line is configured to delay optical pulses produced by one of the optical modulators by a respective length of time unique to the optical modulator to produce a respective optical output signal. In some implementations, the respective lengths of time are multiples of the duration of the optical pulses. An optical combiner is configured to combine the optical output signals to produce a single optical output beam.

In some implementations, the single output beam is transmitted through an optical fiber to an optical deserializer. The optical deserializer is configured to receive the single optical beam and separate the optical output signals from the single optical beam. The optical deserializer is further configured to provide the optical output signals as respective bits of a parallel data bus.

Figure 7:
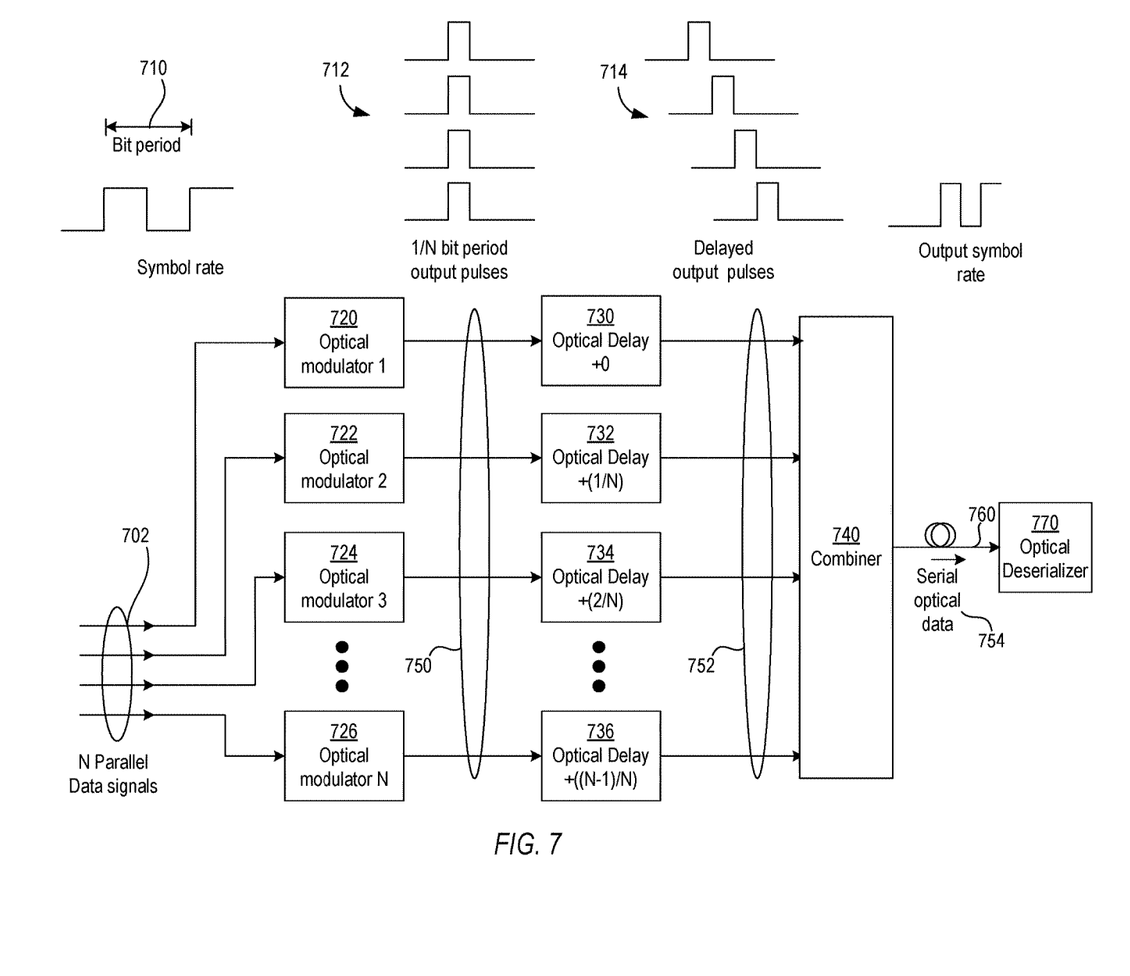
FIG. 7 shows an optical serializer, in accordance with one or more implementations.

Turning again to the figures, FIG. 7 shows an optical serializer, in accordance with one or more implementations. The optical serializer comprises a plurality of optical modulators 720, 722, 724, and 726, which may be controllable lasers or optical multiplexors, such as Mach-Zehnder modulators. Each of the optical modulators is configured to receive a respective bit of an electrical N-bit data bus 702 in each bit period 710. Each optical modulator is configured to output a respective optical pulse 750 representing the value of the received bit. Example output pulses 750 produced by the optical modulators 720, 722, 724, and 726 are shown by waveforms 712. In this example, each of the output pulses has a duration equal to 1/N of the bit period 710.

The optical serializer also includes a set of optical delay lines 730, 732, 734, and 736. Each optical delay line is configured to delay the optical pulses output by each optical modulator by a respective length of time unique to the optical modulator to produce a respective optical output signal 752. In this example, each of the optical delay lines delays optical pules by a respective multiple of the duration of the output pulses (i.e., bit period/N). In some implementations, the respective multiple of the duration for one of the optical delay lines (e.g., 730) may be zero. Example output signals 752 are shown by waveforms 714. As illustrated by waveforms 714, each output pulse coincides with a respective time period. An optical combiner 740 is configured to combine the output signals 752 to produce a combined output signal 754. In some implementations, the combined output signal 754 is transmitted through an optical fiber 760 as a single optical beam to an optical deserializer 770. The optical deserializer 770 is configured to receive the single optical beam and separate the optical output signals from the single optical beam. The optical deserializer 770 is further configured to provide the optical output signals as respective bits of a parallel data bus.

Apparatuses and methods are disclosed for providing a configurable optical channel with user configurable parameters. In some implementations, an optical transmitter circuit includes a set of optical communication circuits, each configured to communicate optical data according to a different configuration of a parameter (e.g., modulation, data rate, frequency, polarization, and/or phase). The optical transmitter circuit includes a selection circuit that is configured to select one of the set of optical communication circuits for operation in response to a first control signal. By selecting different ones of the set of optical communication circuits at different times, the operation of the optical transmitter circuit can be adjusted by way of the different configurations of the parameter.

In some implementations, the set of optical communication circuits may include a plurality of lasers exhibiting respective characteristics. For example, in some implementations, each laser produces light of a respective frequency. By selecting different ones of the lasers for operation, frequency of an optical data signal produced by the optical transmitter may be adjusted.

As another example, the set of optical communication circuits includes a plurality of optical delay lines, each configured to delay an optical data signal produced by the optical transmitter circuit by a different amount of time. By selecting different ones of the optical delay lines, a phase of an optical data signal output by the optical transmitter may be adjusted.

Figure 8:
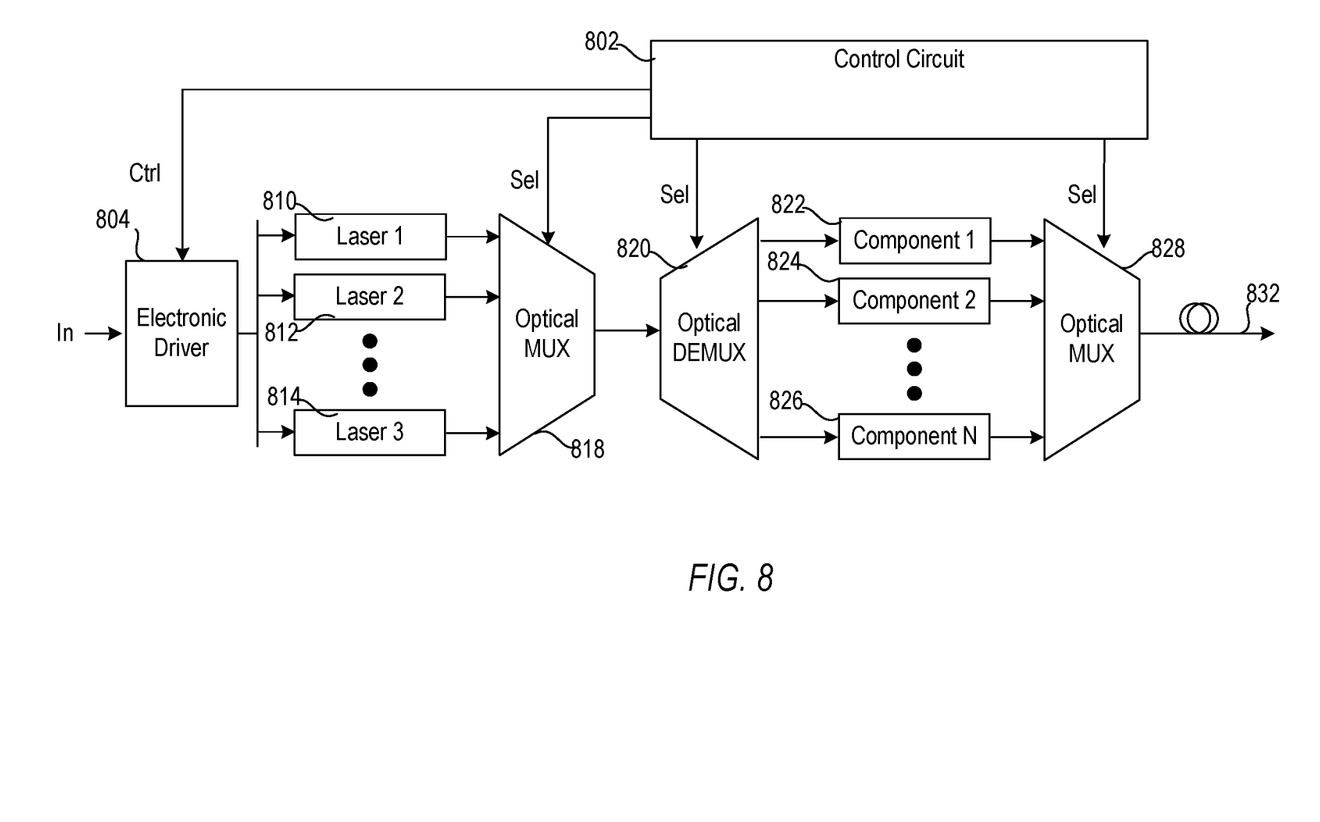
FIG. 8 shows a configurable optical transmitter, in accordance with one or more implementations.

Turning again to the figures, FIG. 8 shows a configurable optical transmitter, in accordance with one or more implementations. In this example, the transmitter includes an electronic driver 804 configured to provide an electronic signal to a plurality of lasers 810, 812, and 814 for transmission. Each of the lasers is configured to output a respective optical data signal, encoding the electronic signal. Each of the lasers exhibits a unique configuration of an optical parameter. For instance, the lasers may exhibit respective frequencies, temperature ranges, and/or light intensities. The transmitter includes a selection circuit configured to select one of the lasers for operations. In this example, the selection circuit includes an optical multiplexor 818 configured to output an optical data signal from one of the lasers that is selected by control circuit 802. The optical multiplexor 818 blocks optical data signals from other ones of the lasers. In some other implementations, the selection circuit may include a circuit configured to enable a selected one of the lasers and disable non-selected ones of the lasers. An optical combiner may be used in lieu of an optical multiplexor 818 to merge optical data signals from the selected ones of the lasers.

In some implementations, the control circuit 802 may also adjust the configuration of various parameters of the electronic driver circuit 804. For example, the electronic driver circuit 804 may be configured to adjust transmission rate and/or modulation algorithm used to encode data values (e.g., amplitude/frequency modulation) in response to control signals from the control circuit 802.

In this example, the optical transmitter also includes a set of optical components 822, 824, and 826 that may be selected to configure one or more optical parameters of an optical data signal. The set of optical components 822, 824, and 826 may include, but are not limited to, optical delays, polarization filters, and/or spectrum filters.

In this example, an optical demultiplexor 820 is configured to provide an optical data signal to one of the optical components 822, 824, and 826, which is selected by the control circuit 802. An optical multiplexor 828 is configured to output an optical data signal from the one of the optical components 822, 824, and 826, which is selected by the control circuit 802. The optical multiplexor transmits the selected optical data signal over an optical fiber 832.

In this example, the transmitter includes two respective sets of circuits that may be selected for operation (e.g., the set of lasers 810, 812, and 814; and the set of optical components 822, 824, 826). In some implementations, a transmitter may only include one set of circuits that may be selected for operation (e.g., either the set of lasers or the set of components). Conversely, in some implementations, a transmitter may include three or more respective sets of circuits that may be selected for operation. In some implementations, optical modulators, such as Mach-Zehnder modulators, may be controlled in place of the lasers, wherein the optical modulators control the intensity of laser light sent to optical multiplexor 818.

Figure 9:
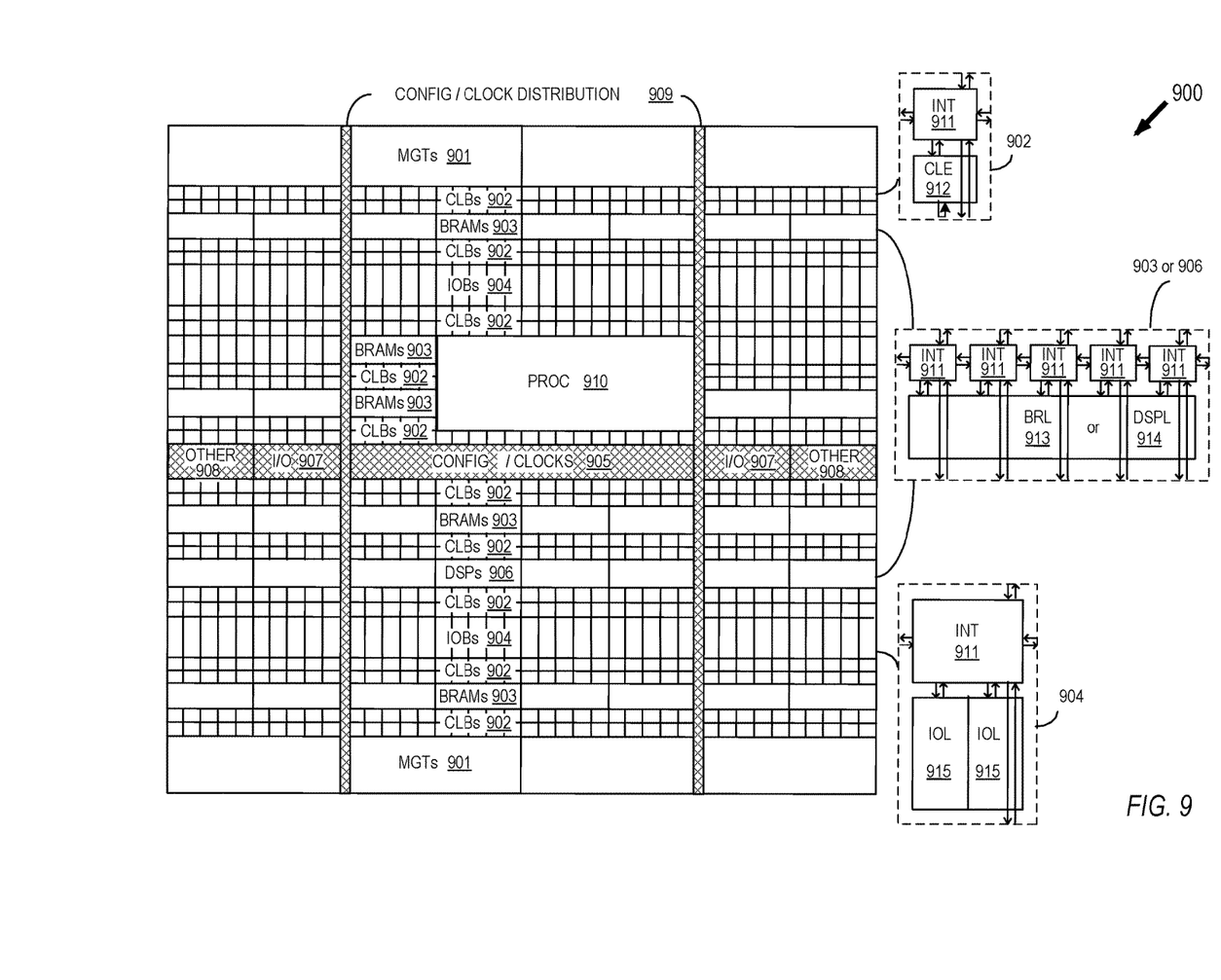
FIG. 9 shows a programmable IC that may be configured, in accordance with one or more implementations.

The various implementations may be applicable to various applications using optical data communication. As one example, a programmable IC may include an input/output block configured to communicate data over an optical fiber. FIG. 9 shows an example programmable IC that may be configured for optical communication in accordance with one or more implementations. This example shows a type of programmable IC known as a Field-programmable-gate-array (FPGA). FPGAs can include several different types of programmable logic blocks in the array. For example, FIG. 9 illustrates an FPGA architecture (900) that includes a large number of different programmable tiles including multi-gigabit transceivers (MGTs) 901, configurable logic blocks (CLBs) 902, random access memory blocks (BRAMs) 903, input/output blocks (IOBs) 904, configuration and clocking logic (CONFIG/CLOCKS) 905, digital signal processing blocks (DSPs) 906, specialized input/output blocks (I/O) 907, for example, clock ports, and other programmable logic 908 such as digital clock managers, analog-to-digital converters, system monitoring logic, and so forth. Some FPGAs also include dedicated processor blocks (PROC) 910 and internal and external reconfiguration ports (not shown). In some implementations, at least one of the IOBs 904 is configured to communicate optical data in accordance with one or more of the above described implementations.

In some FPGAs, each programmable tile includes a programmable interconnect element (INT) 911 having standardized connections to and from a corresponding interconnect element in each adjacent tile. Therefore, the programmable interconnect elements taken together implement the programmable interconnect structure for the illustrated FPGA. The programmable interconnect element INT 911 also includes the connections to and from the programmable logic element within the same tile, as shown by the examples included at the top of FIG. 9.

For example, a CLB 902 can include a configurable logic element CLE 912 that can be programmed to implement user logic, plus a single programmable interconnect element INT 911. A BRAM 903 can include a BRAM logic element (BRL) 913 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 906 can include a DSP logic element (DSPL) 914 in addition to an appropriate number of programmable interconnect elements. An 10B 904 can include, for example, two instances of an input/output logic element (IOL) 915 in addition to one instance of the programmable interconnect element INT 911. As will be clear to those of skill in the art, the actual I/O bond pads connected, for example, to the I/O logic element 915, are manufactured using metal layered above the various illustrated logic blocks, and typically are not confined to the area of the input/output logic element 915.

In the pictured example, a columnar area near the center of the die (shown shaded in FIG. 9) is used for configuration, clock, and other control logic. Horizontal areas 909 extending from this column are used to distribute the clocks and configuration signals across the breadth of the FPGA.

Some FPGAs utilizing the architecture illustrated in FIG. 9 include additional logic blocks that disrupt the regular columnar structure making up a large part of the FPGA. The additional logic blocks can be programmable blocks and/or dedicated logic. For example, the processor block PROC 910 shown in FIG. 9 spans several columns of CLBs and BRAMs.

Note that FIG. 9 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 9 are purely exemplary. For example, in an actual FPGA, more than one adjacent column of CLBs is typically included wherever the CLBs appear, to facilitate the efficient implementation of user logic.

The methods, circuits, and systems are thought to be applicable to a variety of systems and applications which utilize optical communication. Other aspects and features will be apparent to those skilled in the art from consideration of the specification. Though aspects and features may in some cases be described in individual figures, it will be appreciated that features from one figure can be combined with features of another figure even though the combination is not explicitly shown or explicitly described as a combination. The methods, circuits, and systems may be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. An apparatus comprising,
a package substrate having one or more wiring layers;
a first interposer mounted on the package substrate and having one or more wiring layers;
a second interposer mounted on the package substrate;
a logic circuit;
an optical interface circuit connected to the logic circuit via the first interposer; and
wherein:
one of the optical interface circuit or the logic circuit is mounted on the first interposer, and the other one of the optical interface circuit or the logic circuit is mounted on the second interposer;
the optical interface circuit is connected to the logic circuit via the first interposer and the second interposer; and
the optical interface circuit includes:
a driver circuit configured to receive electronic data signals from the logic circuit and carried over the one or more wiring layers of the package substrate and the one or more wiring layers of the interposer; and an optical transmitter circuit coupled to the driver circuit and configured to output optical data signals encoding the electronic data signals.

2. The apparatus of claim 1, wherein:
the optical interface circuit further includes a serializer circuit configured to receive parallel data from the logic circuit, serialize the parallel data, and provide the serialized data to the driver circuit as the electronic data signals.

3. The apparatus of claim 2, wherein the serializer circuit and the driver circuit are connected by signal lines having lengths less than or equal to $\frac{1}{8}$ the wavelength of a highest frequency used by the serializer circuit to provide the serialized data to the driver circuit.

4. The apparatus of claim 1, further comprising:
a serializer circuit mounted on the first interposer and configured to receive parallel data from the logic circuit, serialize the parallel data, and provide the serialized data to the driver circuit, via the first and second interposers.

5. The apparatus of claim 1, wherein the optical transmitter circuit includes:
a first set of optical communication circuits configured and arranged to communicate optical data with a different setting of a first parameter; and
a selection circuit configured and arranged to select one of the first set of optical communication circuits for operation in response to a first control signal.

6. The apparatus of claim 5, wherein the first set of optical communication circuits includes a plurality of lasers.

7. The apparatus of claim 5, wherein the first set of optical communication circuits includes a plurality of optical modulators.

8. The apparatus of claim 5, further comprising:
a second set of optical communication circuits configured and arranged to modulate an optical data signal output by the first set of optical communication circuits, each of the second set of optical communication circuits configured to modulate a second parameter of the optical data signal by a respective amount; and
wherein the selection circuit is further configured and arranged to select one of the second set of optical communication circuits for operation in response to a second control signal.

9. A method, comprising
mounting a logic circuit on a first interposer having one or more wiring layers;
forming an optical interface circuit on a second interposer having one or more wiring layers by mounting an optical transmitter circuit on the second interposer, mounting a driver circuit on the second interposer, and connecting the driver circuit via the one or more wiring layers on the second interposer;
mounting the first interposer on a substrate having one or more wiring layers;
mounting the second interposer on the substrate; and
connecting the logic circuit and the optical interface circuit via the one or more wiring layers of the first interposer, the one or more wiring layers of the substrate, and the one or more wiring layers of the second interposer.

10. The method of claim 9, wherein the forming of the optical interface circuit on a second interposer further includes mounting a serializer circuit on the second interposer, the serializer circuit being configured to receive parallel data from the logic circuit, serialize the parallel data, and provide the serialized data to the driver circuit.

11. The method of claim 10, further comprising:
connecting the serializer circuit and the driver circuit using signal lines having lengths less than or equal to $\frac{1}{8}$ the wavelength of a highest frequency used by the serializer circuit to provide the serialized data to the driver circuit.

12. The method of claim 9, further comprising:
mounting a serializer circuit on the first interposer, wherein the serializer circuit is configured to receive parallel data from the logic circuit, serialize the parallel data, and provide the serialized data to the driver circuit, via the first and second interposers.

* * * * *